(12) United States Patent
Berkcan et al.

(10) Patent No.: US 7,466,121 B2
(45) Date of Patent: Dec. 16, 2008

(54) MEMS BASED CURRENT SENSOR USING MAGNETIC-TO-MECHANICAL CONVERSION AND REFERENCE COMPONENTS

(75) Inventors: Ertugrul Berkcan, Clifton Park, NY (US); Christopher James Kapusta, Duanesburg, NY (US); Glenn Scott Claydon, Wynantskill, NY (US); Anis Zribi, Rexford, NY (US); Laura Jean Meyer, Schenectady, NY (US); Wei-Cheng Tian, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/506,493

(22) Filed: Aug. 18, 2006

(65) Prior Publication Data
US 2007/0052410 A1    Mar. 8, 2007

Related U.S. Application Data

(62) Division of application No. 10/863,442, filed on Jun. 7, 2004, now Pat. No. 7,112,951.

(51) Int. Cl.
*G01R 33/00* (2006.01)
(52) U.S. Cl. .................................. 324/126; 324/117 R
(58) Field of Classification Search .................. None
See application file for complete search history.

(56) References Cited

U.S. PATENT DOCUMENTS 5,952,819 A    9/1999   Berkcan et al.

| | | | |
|---|---|---|---|
| 6,188,322 B1 * | 2/2001 | Yao et al. | 340/664 |
| 6,348,788 B1 | 2/2002 | Yao et al. | |
| 6,664,786 B2 | 12/2003 | Kretschmann et al. | |
| 6,690,178 B2 | 2/2004 | Harris et al. | |
| 6,734,660 B1 | 5/2004 | Berkcan et al. | |
| 2002/0021122 A1 | 2/2002 | Yao et al. | |
| 2002/0158040 A1 | 10/2002 | Lucak et al. | |

FOREIGN PATENT DOCUMENTS

| EP | 1006365 | 6/2000 |
|---|---|---|
| EP | 1306678 | 5/2003 |
| WO | WO 03012459 | 2/2003 |

OTHER PUBLICATIONS

U.S. Appl. No. 10/854,845, filed May 27, 2004, Glenn Claydon et al.
U.S. Appl. No. 11/129,682, filed May 13, 2005, Ertugrul Berkcan et al.

* cited by examiner

*Primary Examiner*—Minh N Tang
(74) *Attorney, Agent, or Firm*—Paul J. DiConza

(57) ABSTRACT

A micro-electromechanical system (MEMS) current sensor is described as including a first conductor, a magnetic field shaping component for shaping a magnetic field produced by a current in the first conductor, and a MEMS-based magnetic field sensing component including a magneto-MEMS component for sensing the shaped magnetic field and, in response thereto, providing an indication of the current in the first conductor. A method for sensing a current using MEMS is also described as including shaping a magnetic field produced with a current in a first conductor, sensing the shaped magnetic field with a MEMS-based magnetic field sensing component having a magneto-MEMS component magnetic field sensing circuit, and providing an indication of the current in the first conductor.

6 Claims, 8 Drawing Sheets

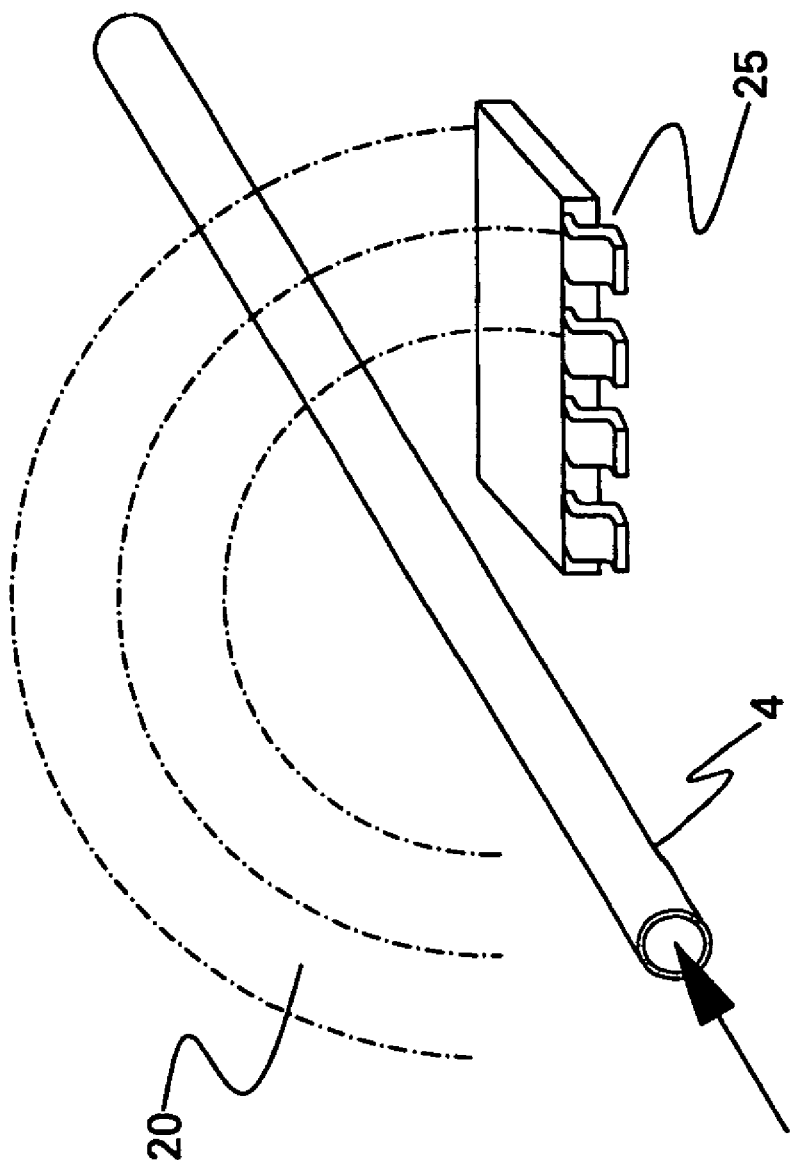

MEMS BASED CURRENT SENSOR USING MAGNETIC-TO-MECHANICAL CONVERSION AND REFERENCE COMPONENTS

RELATED APPLICATIONS

The present application is a Divisional of application Ser. No. 10/863,442, filed Jun. 7, 2004, and issued as U.S. Pat. No. 7,112,951 on Sep. 26, 2006, which is herein incorporated by reference.

BACKGROUND

The present disclosure relates generally to the field of electrical current sensing devices. More particularly, the present disclosure relates to a micro-electromechanical system (MEMS) based current sensor using a force acting between current carrying conductors and a mutually inductive coupling.

Sensors for sensing a current based on the force between two current conductors are known in the art. It is known that a current carrying conductor produces a magnetic field in the vicinity of the current carrying conductor. It is also known that the magnetic field produced by the current carrying conductor can induce a force with another current carrying conductor disposed in the magnetic field produced by that current carrying conductor. While such known current sensors are capable of detecting currents in the "macro world", they are not suitable for sensing currents in the nanotechnology scale environment of mechanical and electromechanical devices produced by micromachining processes.

Additionally, such known current sensors have several disadvantages. In general, the physical and electrical operating characteristics of such known current sensors are not compatible with sensing currents in the nanotechnology scale environment. The physical dimensions of these current sensors are one barrier. The electrical operating characteristics also prove disadvantageous in that a magnetic field produced by a current carrying conductor and sensed by the macro-sized current sensor tends to vary across the area of the sensor. This introduces an error that must be compensated for in order to achieve accurate current measurements. Also, known current sensors are individually fabricated and packaged devices dedicated to performing a single function in the process of current sensing. Each of these attributes adds cost and application limitations of the current sensor. Further, the macro-sized current sensors tend to produce heat, thereby reducing the efficiency of the current sensors and introducing a possible error factor to the accuracy of the current sensor.

Thus, there exists a need in the art for a MEMS-based current sensor using the force between current carrying conductors and a mutually inductive coupling that overcomes one or more of the aforementioned deficiencies of known current sensors using the force between current carrying conductors.

SUMMARY

In one exemplary embodiment, there is provided a micro-electromechanical system (MEMS) current sensor including a magnetic field shaping component for shaping a magnetic field produced by a current in a first conductor, and a MEMS-based magnetic field sensing component having a magneto-MEMS component for sensing the shaped magnetic field and, in response thereto, providing an indication of the current in the first conductor.

In another exemplary embodiment, there is provided a method of sensing a current using a micro-electromechanical system (MEMS) comprising shaping a magnetic field produced by a current in a first conductor, and sensing the shaped magnetic field by a MEMS-based magnetic field sensing component having a magneto-MEMS component magnetic field sensing circuit for sensing the shaped magnetic field and, in response thereto, providing an indication of the current in the first conductor.

DRAWINGS

Figure 1:
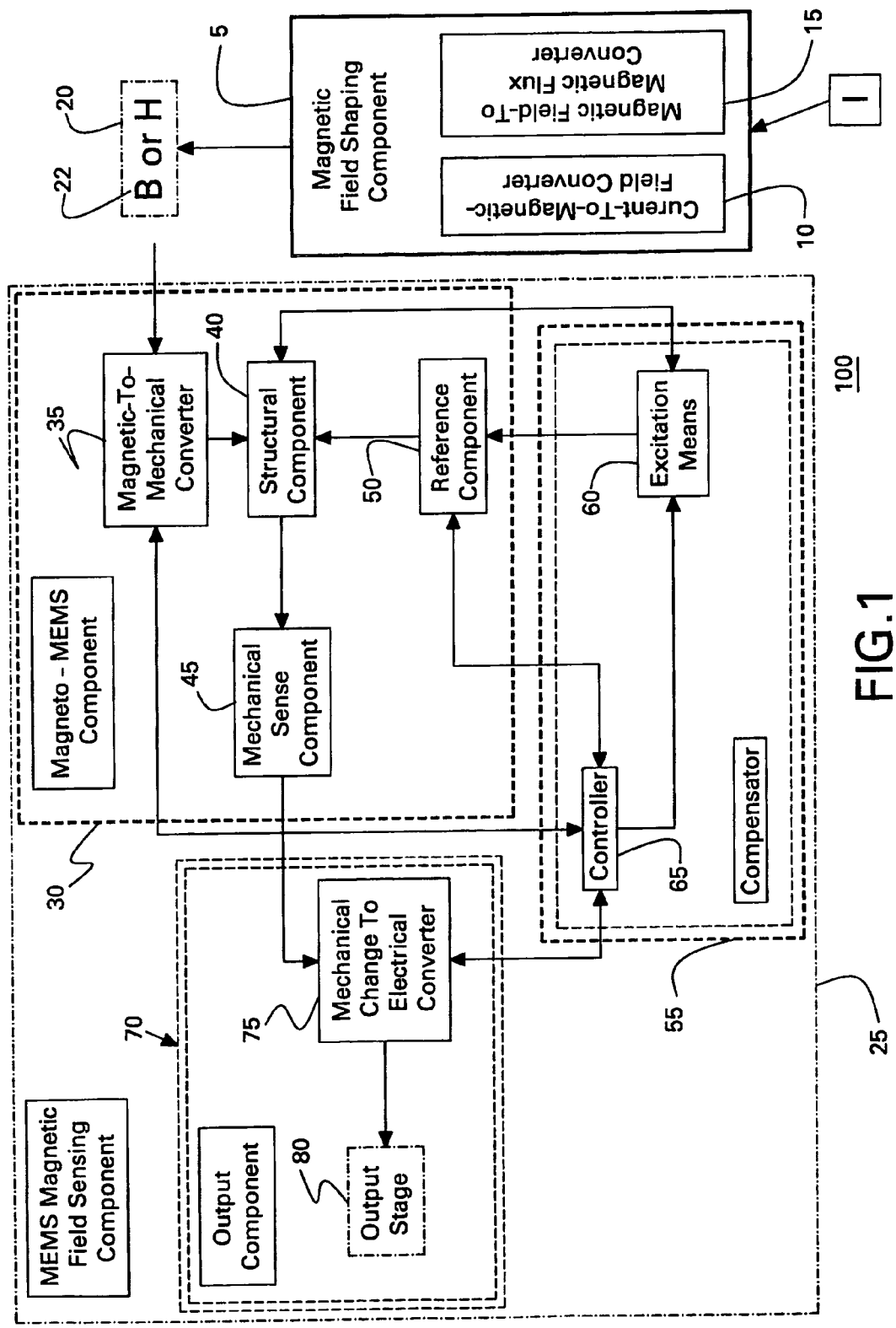
FIG. 1 is a schematic diagram representative of a MEMS-based current sensor constructed in accordance with an embodiment of the invention.

FIGS. 2(*b*)-(*c*) are exemplary depictions of the MEMS-based current sensor of FIG. 1.

FIGS. 3(*a*)-(*c*) are exemplary depictions of the MEMS-based current sensor of FIG. 1.

Figure 4B:
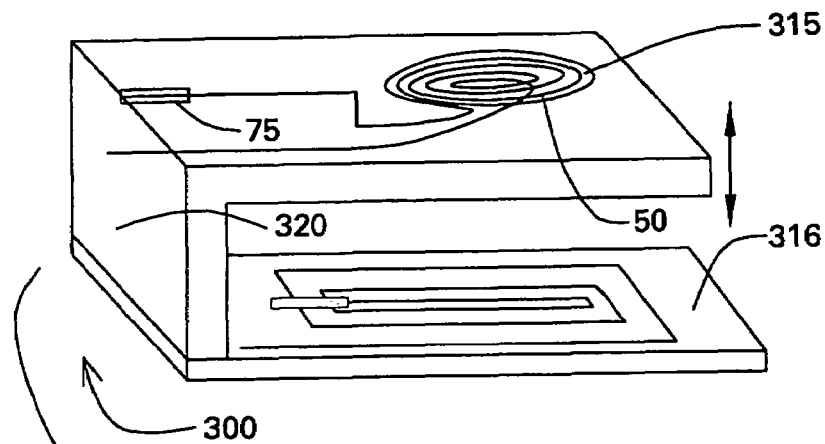
Figure 4B:
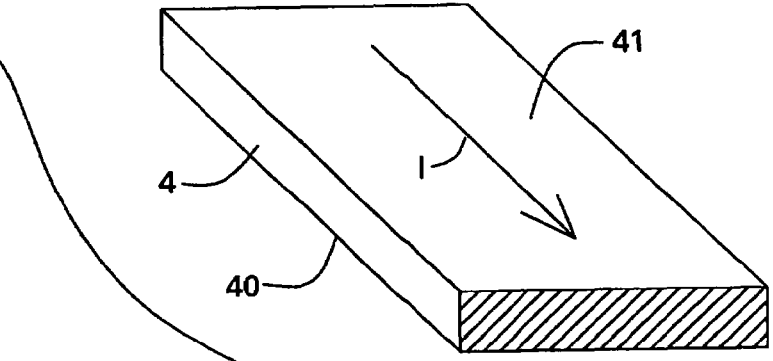

FIGS. 4(*a*) and (*b*) illustrate a MEMS based current sensor constructed in accordance with another embodiment of the invention.

FIGS. 5(*a*) and (*b*) are exemplary depictions of magnetic field shaping in accordance with another embodiment of the invention.

DETAILED DESCRIPTION

With reference to FIG. 1, there is shown a schematic diagram representative of a MEMS-based current sensor in accordance with the disclosure herein, generally represented by reference numeral 100. The MEMS-based current sensor 100 uses, for example, a force between current carrying conductors, a mutual inductance induced between terminals of a second conductor in a magnetic field, to sense (i.e., detect) and determine characteristics (e.g., magnitude and direction) of a current I in a first current carrying conductor. In case the terminals of this conductor are shorted together, this mutually inductive coupling results in a back electromotive force due to the Lenz law. In general, the method of sensing the current in the first current carrying conductor includes a process of magnetic field shaping by a magnetic field shaping component 5 and a process of magnetic field sensing by a magnetic field sensing component 25. The magnetic field shaping component 5, and in particular a magnetic field-to-magnetic flux density converter 15 thereof, may be implemented using MEMS devices. The magnetic field sensing component 25 is preferably implemented using MEMS devices to provide a current sensor that is highly accurate, reliable, robust, and introducing little to no error to the current being sensed.

The size of the MEMS current sensor 100 facilitates the sensing of currents in applications where space is limited. The use of MEMS-based components contributes to the reliability of the current sensor 100. Due, at least in part, to the non-contact sensing methods of sensing current using MEMS current sensors 100, the MEMS current sensor 100 preferably has no impact on the magnitude and/or direction of the current being sensed. For example, sensing current using the MEMS current sensor 100 preferably introduces very little (i.e., preferably negligible) error into the current being sensed. Given the dimensions of MEMS-based components and the sensitivity of the same, the MEMS current sensor 100 preferably does not introduce or cause any appreciable variation or change in the current being sensed or measured. Moreover, the MEMS current sensor 100 is advantageous for its reduced cost and significantly reduced size. Further, due to microlithography and micro-fabrication techniques, the fabrication of the MEMS current sensor 100 is advantaged through increased accuracy and precision.

The MEMS-based current sensor 100 operates to sense and determine the current in a first conductor by making use of either the force acting between, a conductor carrying an unknown current and a reference current positioned in the magnetic field produced by the unknown current carrying conductor or the mutual inductance induced between terminals of a reference conductor. It is known that a current carrying conductor generates a magnetic field in the vicinity of the current carrying conductor. It is also known that a current carrying conductor placed in the magnetic field generated by a first current carrying conductor will have a force acting on it proportional to the current in the first current carrying conductor. Accordingly, it is possible to sense a current carrying conductor without having to make physical contact with the current carrying conductor. It is similarly known that a second conductor placed in the magnetic field generated by the first current carrying conductor will have a mutual induction generated between terminals of the second conductor as governed by the Lenz law. Accordingly, since the magnetic flux due to the first conductor varies in time, there will be a voltage induced between terminals of the second conductor that is proportional to the time rate of change of the flux. Alternatively, if the terminals of the second conductor are shorted, there will be a back electromotive force acting on the second conductor due to mutually inductive coupling.

There may be a number of forces that act on current carrying conductors. These forces include a Lorentz force generated between the two current carrying conductors, and a mutual inductance generated by a second conductor due to the time rate of change of the magnetic flux due to one of the current carrying conductors. The characteristics of each of these types of known electromagnetic ways of inducing a change based in a magneto-MEMS component can be used in accordance with the disclosure herewith to provide the MEMS-based current sensor 100.

Referring to FIG. 1, the magnetic field shaping component 5 shapes a magnetic field produced by a current I flowing in a first conductor. The current I flowing in the first conductor is the current being sensed, detected, and preferably quantified. The process of shaping current I includes providing the detected current I in a form that is suitable for use by the other components of the MEMS-based current sensor 100. Depending on the particular implementation of the other components interfaced with the magnetic field shaping component 5, the magnetic field shaping component 5 can include a current-to-magnetic-field (H) converter 10 and a magnetic-field-to-magnetic flux density (B) converter 15. The process of shaping current I includes providing the first conductor that the detected current I flows through in a form that is suitable for use by the other components of the MEMS-based current sensor 100. The process of shaping current I also includes shaping the conductor through which the detected current I flows in a form to provide a magnetic field that is uniform in magnitude and/or direction. The shaping of the current carrying conductor may be done to render the detection of the magnetic field more suitable for use by the other components of the MEMS-based current sensor 100. That is, the shaping of the current carrying conductor can be used to effectuate the magnetic field shaping of magnetic field shaping component 5.

The electric current carrying conductor is surrounded by a magnetic field as a consequence of the electric current flowing therein. The magnetic field is a vector quantity, i.e., it has a direction and a magnitude. The current-to-magnetic field converter 10 shapes the magnetic field, H (20), such that it is shaped into a usable and reliable vector field in space for use by the other components of the MEMS based current sensor 100. The magnetic field-to-magnetic flux converter 15 converts the magnetic field produced by the electric current flowing in the first conductor to a corresponding magnetic flux density, B (22), of the electric current such that it is shaped into a usable and reliable magnetic flux density vector field for use by the other components of the MEMS-based current sensor 100.

In one aspect, the magnetic field shaping component 5 can include either the current-to-magnetic-field converter 10 or the magnetic-field-to-magnetic flux density converter 15, or both. The magnetic field shaping component 5 provides a shaped magnetic field 20 and/or a magnetic flux density 22 corresponding to the current I being sensed. In one aspect, the current-to-magnetic-field converter 10 and the magnetic-field-to-magnetic flux density converter 15 provide a shaped magnetic field 20 and a shaped magnetic flux density 22, respectively, corresponding to the current I being sensed concurrently with each other.

The current-to-magnetic-field converter 10 and the magnetic field-to-magnetic flux density converter 15 may or may not be discrete devices. That is, they may be provided in a single device. Also, the current carrying conductor itself may be shaped to at least contribute to the shaping of the magnetic field. Thus, in one aspect, the magnetic field shaping component 5 may be implemented by configuring the geometric shape of the conductor carrying the current being sensed to shape the magnetic field produced thereby.

Figure 5A:
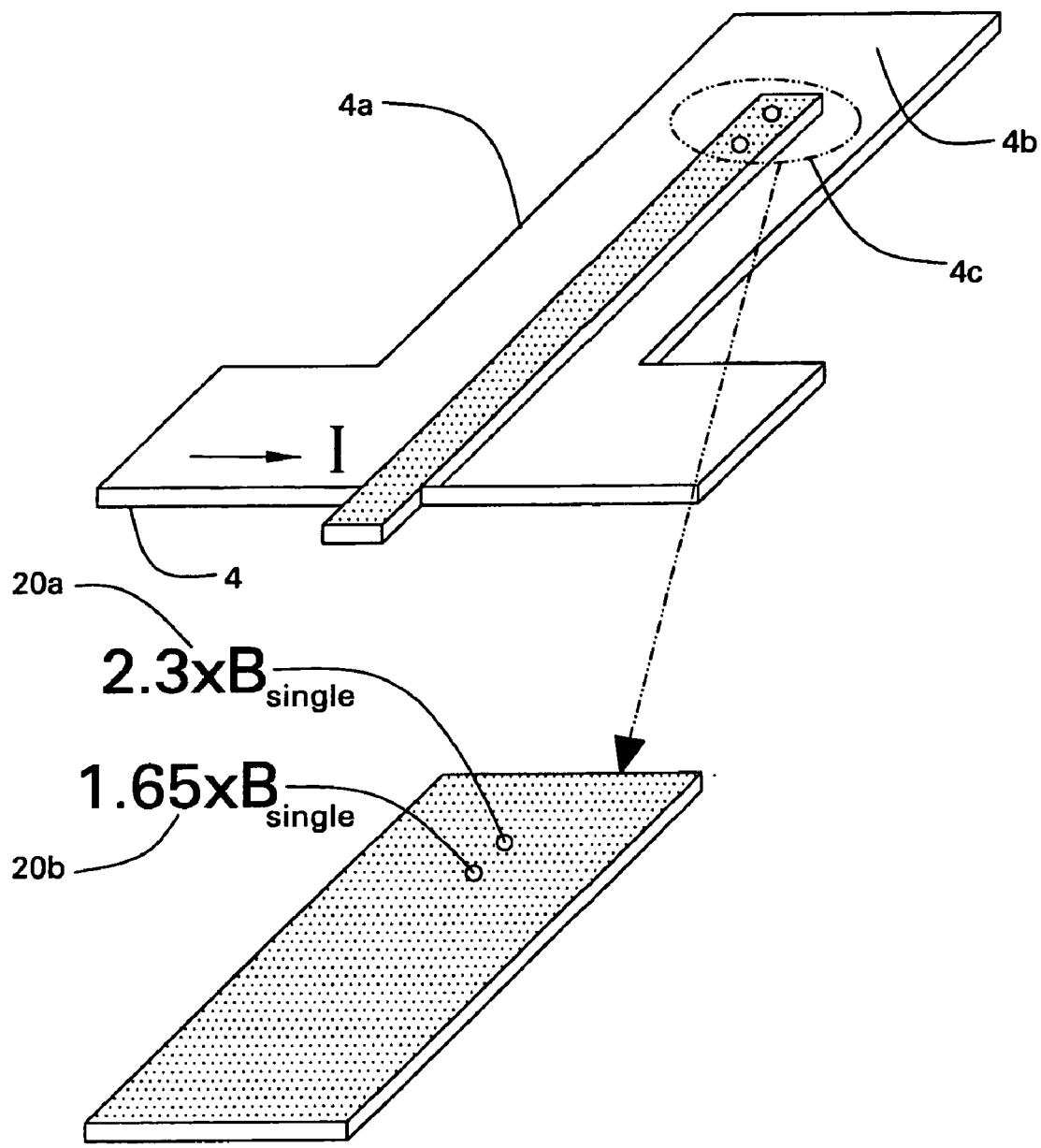
Figure 5B:
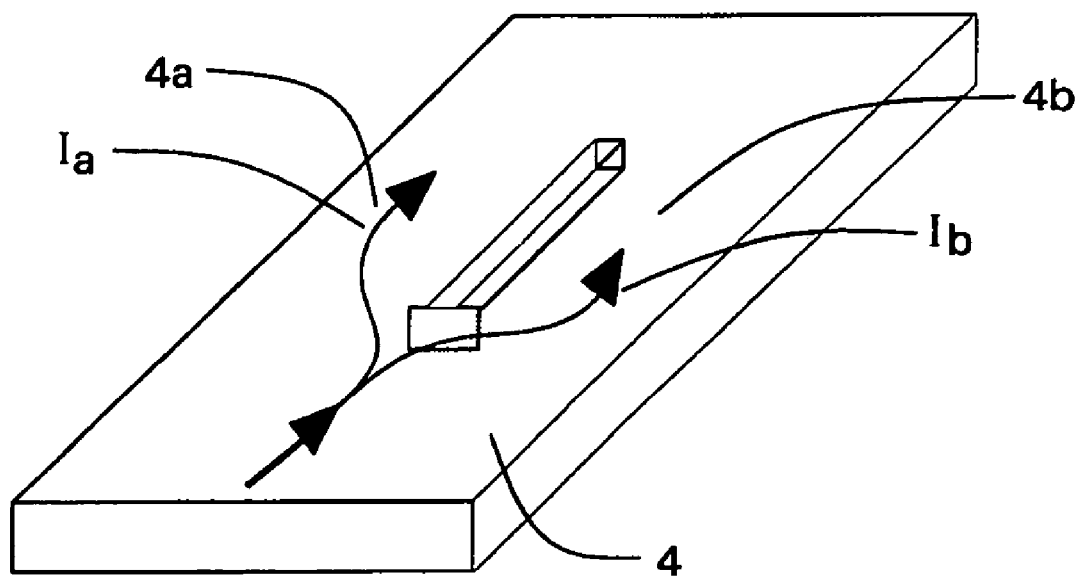

Referring to FIG. 5(a), the magnetic field 20 generated by a current carrying conductor 4 carrying a current I has a generally square "U" shape and a generally rectangular cross-section. The contributions from branches 4a-4c add to generate a magnetic field that is generally shaped to be uniform in direction and magnitude. In addition, the magnetic field and flux density at the apex of the inside of this rectangular-shaped conductor 4 is larger in magnitude than the corresponding values that would be generated by a straight conductor $B_{single}$. As illustrated, the corresponding values would be $2.3 \times B_{single}$ and $1.6 \times B_{single}$, respectively. This illustrates how the current-to-magnetic field converter provides a function of shaping a geometric property of the first conductor 4, shapes a geometric property of at least a branch of the first conductor 4, and assigns a geometrical relationship of the first conductor 4 with respect to at least a branch of the first conductor 4. In another embodiment, the conductor 4 can be divided into two branches as illustrated in FIG. 5(b). A slot is created by respective branches 4a and 4b of the conductor 4, respectively carrying current components Ia and Ib in two substantially parallel paths. In yet another embodiment, an additional flux concentrator may be used as part of the magnetic field-to-magnetic flux converter 15. This flux magnetic flux concentrator includes a high magnetic permeability material disposed and shaped to conform substantially to a magnetic property of the conduct such as the magnetic field created by the currents I, Ia, and Ib.

The shaped magnetic field 20 and/or the magnetic flux density 22 corresponding to the current I being sensed is passed to the MEMS-based magnetic field sensing component 25, as illustrated by the arrow between the magnetic shaping component 5 and the MEMS-based magnetic field sensing component 25 (FIG. 1). The MEMS-based magnetic field sensing component 25 senses the shaped magnetic field 20 and/or the shaped magnetic flux density 22. In response to the sensing of the shaped magnetic field 20 and/or the shaped magnetic flux 22, the MEMS-based magnetic field sensing component 25 provides an indication of the current in the first conductor. Preferably, the sensed current indicator includes both a magnitude and direction component regarding the current being sensed. The sensed current indicator is preferably an electrical indication of the sensed current I.

The illustrated MEMS-based magnetic field sensing component 25 includes a magneto-MEMS component 30 that, among other things, senses the shaped magnetic field and, in response thereto, converts the sensed shaped magnetic field 20 and the shaped magnetic flux density 22 to the mechanical indicator of the sensed current I. The MEMS-based magnetic field sensing component 25 also includes a compensator 55 for enhancing a function of the MEMS-based magnetic field sensing component 25, and an output component 70 for providing an output indicative of the current I in the first conductor. Output from the output component 70 is preferably an electrical signal indicative and representative of the magnitude and sign of the current I flowing in the first conductor.

Each of the magnetic field shaping component 5 and the MEMS-based magnetic field sensing component 25 includes other components for carrying out the intended functionality thereof. For example, the illustrated magneto-MEMS component 30 includes a magnetic-to-mechanical converter 35 for converting the magnetic representation of the current I (e.g., the shaped magnetic field 20 and the shaped magnetic flux density 22) to a mechanical change, and a structural component 40 for providing a structural support and for being responsive to the mechanical change and providing an indication of the mechanical force. The magneto-MEMS component 30 also includes a mechanical sense component 45 for sensing the mechanical indication provided by structural component 40, and a reference component 50 for providing a reference indicator for the mechanical indication to the structural component 40.

In one aspect, the shaping of the magnetic flux density may be accomplished by using a flux concentrator to obtain a usable and reliable signal representative of the current that can be processed as needed to make an accurate determination of the current being sensed. For example, in one embodiment, the flux concentration can be obtained by using a high permeability material that permits an increased concentration of magnetic flux density therethrough.

The mechanical indicator may be the movement of a structural component that registers, moves, or otherwise indicates the sensing of the magnetic field. In one embodiment, the mechanical indicator is an induced stress on the structural component. In yet another embodiment, the mechanical indicator includes modification of a mechanical property of the structural component 40, such as, for example, the spring constant and the mass thereof. The modification of the mechanical property of the structural component 40 will result in the modification of a characteristic response of the structural component 40. For example, changing the spring constant or weight of the structural component 40 causes the response of the structural component 40, for example, a deflection or compression of the structural component, to accordingly change. The resonance frequency, for example, can be altered by the modification of the mechanical property. Thus, monitoring and detecting the variance in the response of the structural component 40 (e.g., resonance frequency) can be used to detect/determine a change in the mechanical property of the structural component 40, caused by the mechanical indicator from the magnetic-to-mechanical converter 35 corresponding to the current being sensed by the current sensor 100.

The structural component 40 may be a membrane, a cantilever, a bridge, or any number of other structural devices. The mechanical indicator provided by the structural component 40 conveys the vector space value of the mechanical indicator, including one or more of an associated amplitude, direction, speed, and any other characteristic thereof that can be used to convey the vector space value of the mechanical indicator. The mechanical indicator is sensed at the mechanical sense component 45. The sensed mechanical indicator is converted to an interface signal that can be used to further process, interpret, and/or communicate the current sensed by using the generated magnetic field. A mechanical-to-electrical converter 75 of an output component 70 takes the interface signal of the mechanical indicator and converts it to a usable electrical signal for interpretation and/or further processing.

The magneto-MEMS component 30 may include a compensator 55. The compensator 55 preferably includes an excitation means or source 60 and a controller 65. The excitation means 60 provides excitation quanta (i.e., an amount of excitation energy) for use by the MEMS current sensor 100. The controller 65 controls, for example, a switching and an application of the excitation quanta of the excitation means 60 and the reference signal of the reference component 50. In another embodiment, the controller selects between differing values of the excitation quanta and a plurality of reference components 50.

The magneto-MEMS component 30 can include the output component 70. The output component 70 preferably has a mechanical change to the mechanical-to-electrical converter 75 and an output stage 80. The mechanical change to the mechanical-to-electrical converter 75 receives the mechanical indication provided by the mechanical sense component 45 and, in turn, provides an electrical indication representative of the sensed current I to output stage 80. The mechanical change to the mechanical-to-electrical converter 75 may be based on, for example, a metal strain element, a piezoresistive element, a piezoelectric element, a capacitive element, a tunneling element, or an optical element. Output stage 80 may interface with a memory, an indicator (e.g., a display screen), and/or another device or apparatus for further processing (e.g., a digital signal processor or computer-based analyzer).

Figure 2B:
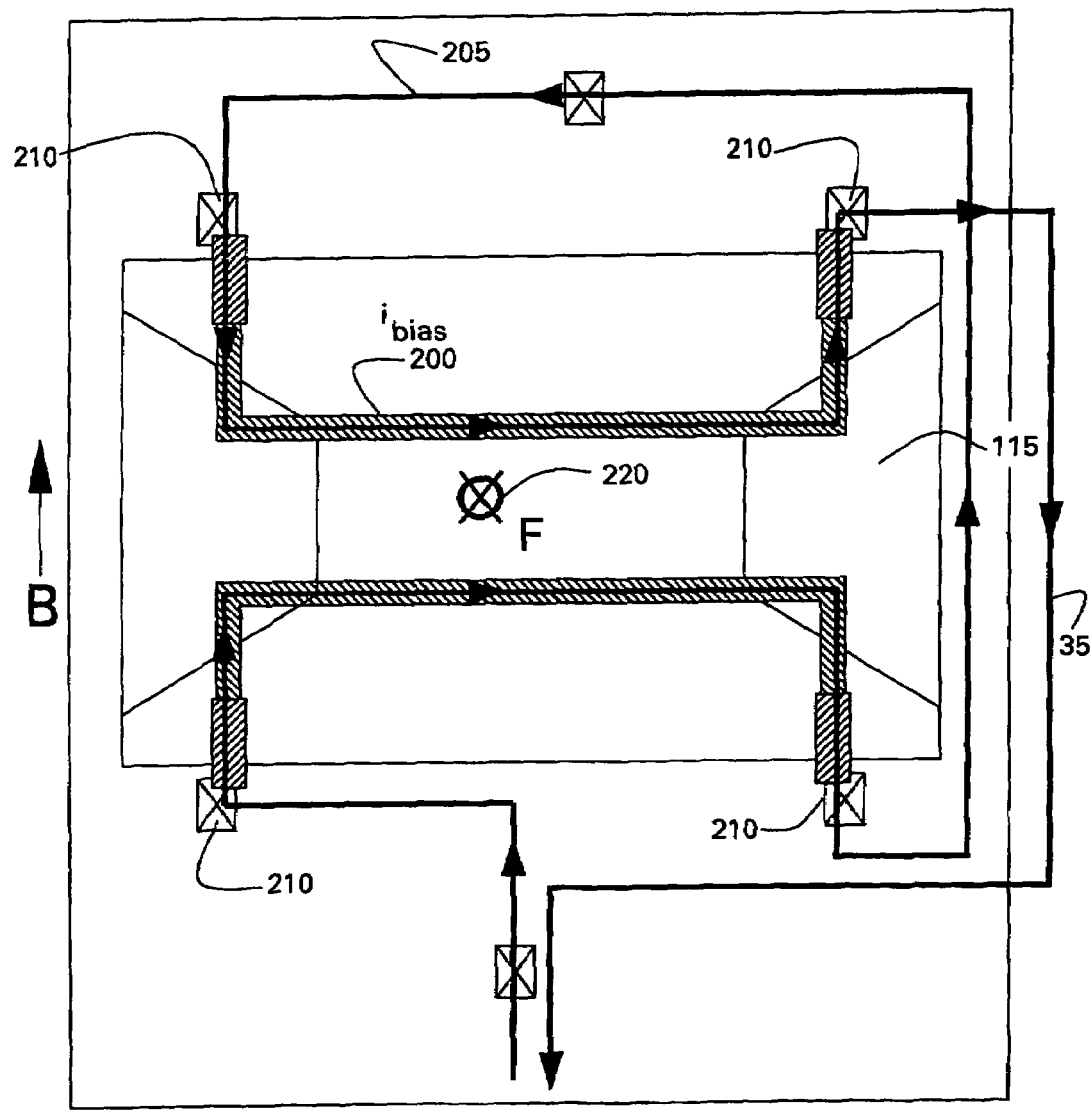
FIG. 2(*a*) is an exemplary depiction of the MEMS-based current sensor and current carrying conductor of FIG. 1.
Figure 2C:
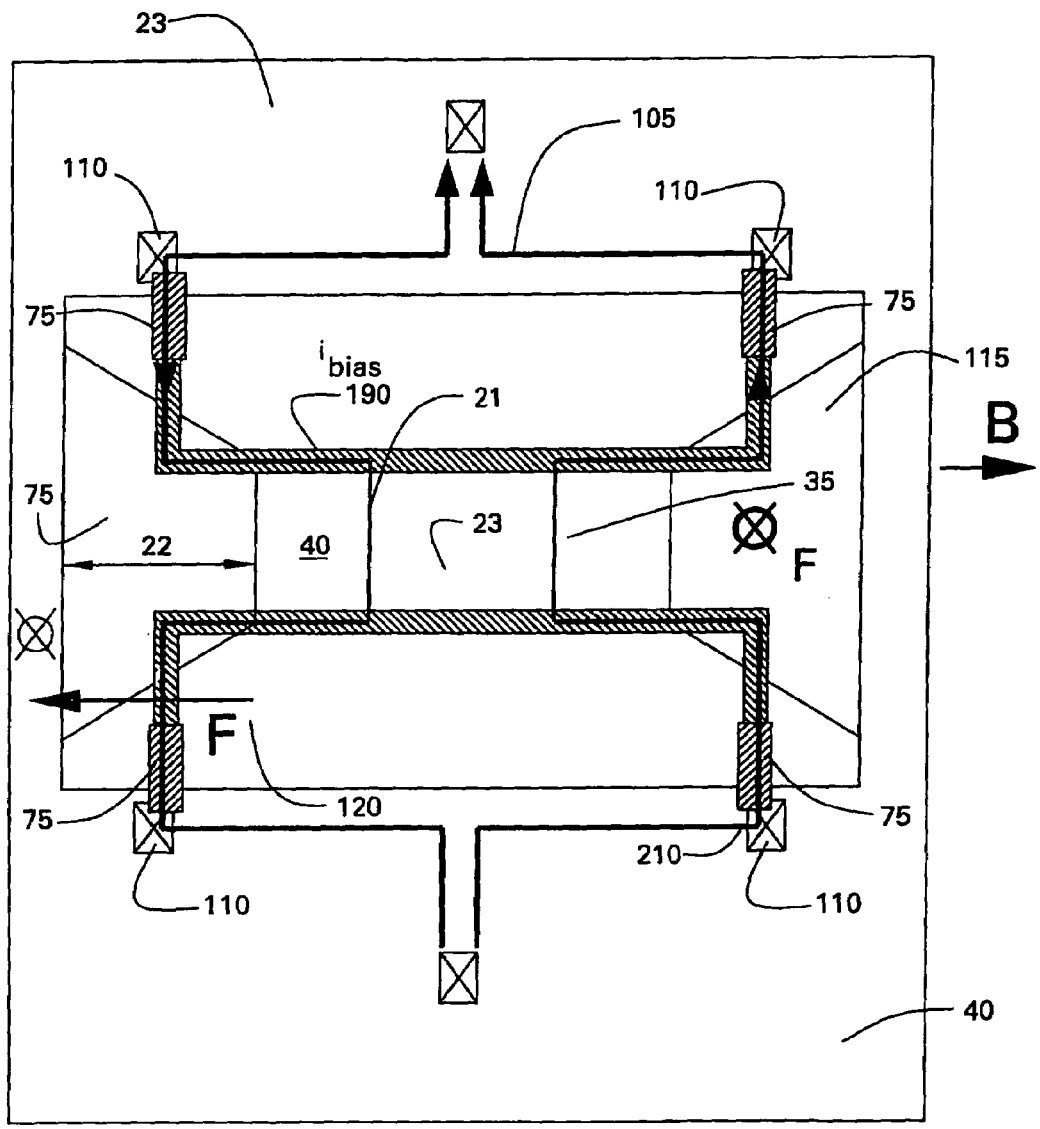

In one aspect, the MEMS-based current sensor 100 provides multi-directional magnetic field sensing. This aspect of the current sensor can be realized by taking advantage of the degrees of freedom offered by MEMS and the micro machining and micro-lithography manufacturing process used therein. Referring to FIGS. 2(a)-(c), there is shown an exemplary MEMS device for detecting a current in a first current carrying conductor (not shown). The unknown current being measured in the first current carrying conductor is coupled to a predetermined bias current 190 (i.e., reference signal) controlled to flow in coil 105 and a predetermined bias current 200 controlled to flow in coil 205. The direction of current flow in each of the coils 105 and 205 is indicated by the directional arrows associated with the bias current 190 and the bias current 200. The coil 105 is supported at certain points thereon by supports 110, and the coil 205 is supported at certain points thereon by supports 210. At a cavity 115, the coil 105 is exposed for coupling to the unknown current being measured in the first current carrying conductor. In the cavity 115, a membrane, for example, is deflected (mechanically moved) in response to, for example, the Lorentz force acting between the reference current carrying coil 105 and the unknown current in the first current carrying conductor, the mutual inductance between a first current carrying coil and the coils 105 and 205, and/or by moving a coil in the magnetic field generated by the current in the first current carrying conductor.

Given the geometrical configuration of the coil 105 and the cavity 115 as shown, allowing for the coupling of the current carrying conductors in only the specified cavity 115, and the direction of the bias current 190, the Lorentz force in the cavity 115 will act to move a mechanical MEMS device in the cavity 115 in a direction as indicated by arrow 120 (FIG. 2(c)).

While discussed primarily in the context of using the Lorentz force between the first and the coil (i.e., second) conductors, the magnetic-to-mechanical converter 35 can be modified to use mutual inductance, a moving loop and a magnetic field generated by the first current carrying conductor. Additionally, other characteristic relationships may be used to derive a mechanical indicator of the mechanical indicator corresponding to the current being sensed.

As illustrated in FIG. 2(b), the coil 205 forms a flexure and is supported at certain points thereon by supports 210. At the cavity 115, the coil 205 is exposed for coupling to the unknown current being measured in the first current carrying conductor. In the cavity 115, a MEMS device membrane, for example, is deflected (mechanically moved) in response to the Lorentz force acting between the current carrying coil 205 and the unknown current in the first current carrying conductor. Given the configuration of the coil 205, the cavity 115 allowing for the coupling of the current carrying conductors in only the cavity 115, and the direction of the bias current 200, the force in the cavity 115 will act to move a mechanical MEMS device in a direction as indicated by an arrow 220.

Using micro-machining and micro-lithography manufacturing processes, exemplary coils 105 and 205 may be constructed in separate layers of conductive metal and insulating layers of material to provide a single MEMS-based current sensor that uses the force between current carrying conductors to sense an unknown current flowing in a first conductor. Thus, as demonstrated herein, multiple functions may be accomplished and utilized by the MEMS-based current sensor in accordance with the present disclosure. Also, the coils of FIGS. 2(b) and 2(c) may be combined to form the MEMS structure of FIG. 2(a). In this manner, a single MEMS current sensor device may be used to detect and sense currents of various directions, magnitudes, and with varying degrees of sensitivity.

In FIG. 2(c), for example, the mechanical-to-electrical converter 75 is shown at the anchor points 110 of coil 105 and the structural support 40. At one anchor point 110, a piezoresistor may be used to detect the magnitude of deflection of the cantilevered coils 105. The amount of stress placed on the piezoresistor is preferably proportional to the amount of deflection experienced by the deflectable membrane and the magnitude of the current flowing in the first conductor. The sidewalls and/or floor of the cavity 115 may be used to detect mechanical changes to the MEMS current sensor as a result of the force exerted thereon by the current being sensed. For example, electrodes, optical sensors, pressure sensors, and other MEMS-based structures may be used to detect the mechanical change(s) caused by the current in the first conductor. The mechanical-to-electrical converter may include a resistive Wheatstone bridge and a capacitive Wheatstone bridge as part of the output component 70.

The mechanical indicator may be the movement of a structural component 40 that registers, moves, or otherwise indicates the sensing of the magnetic field. The structural component 40 may be a membrane, a cantilever, a bridge, or any number of other structural devices. The detection of the mechanical indicator conveys the actuation of the mechanical indicator, including at least one of an associated amplitude, direction, speed, and any other characteristic thereof that can be used to convey the scope of the mechanical indicator. In one embodiment, the structural component 40 includes at least one from a group consisting of a membrane, a cantilever, a deflectable membrane, a diaphragm, a flexure member, a cavity, a surface micro-machined structure, a comb structure, and a bridge. The mechanical indicator is sensed at the mechanical sense component 45. The sensed mechanical indicator is converted to an interface signal that can be used to further process, interpret, and/or communicate the current sensed by using the generated magnetic field. The mechanical-to-electrical converter 75 of an output component 70 takes the interface signal of the mechanical indicator and converts it to a usable electrical signal for interpretation and/or further processing.

Figure 3A:
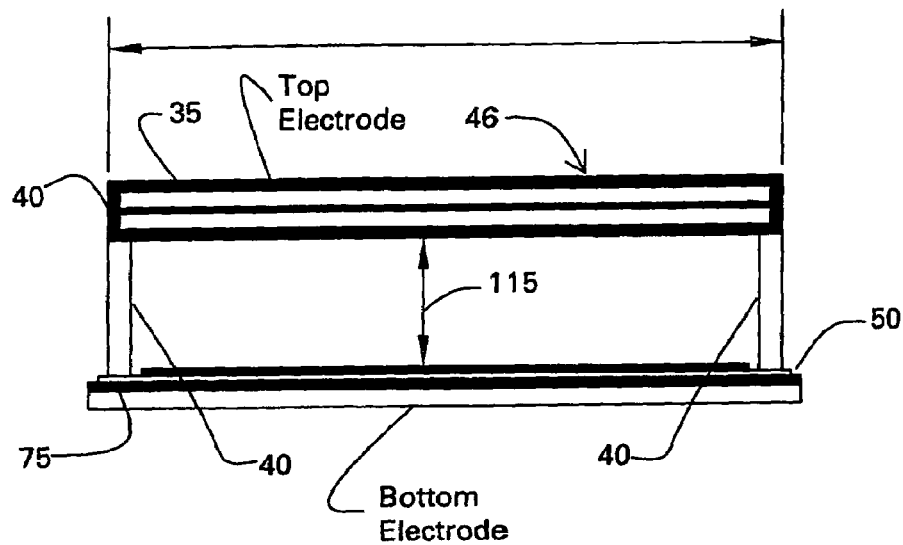
Figure 3B:
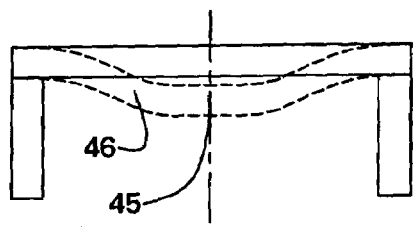
Figure 3C:
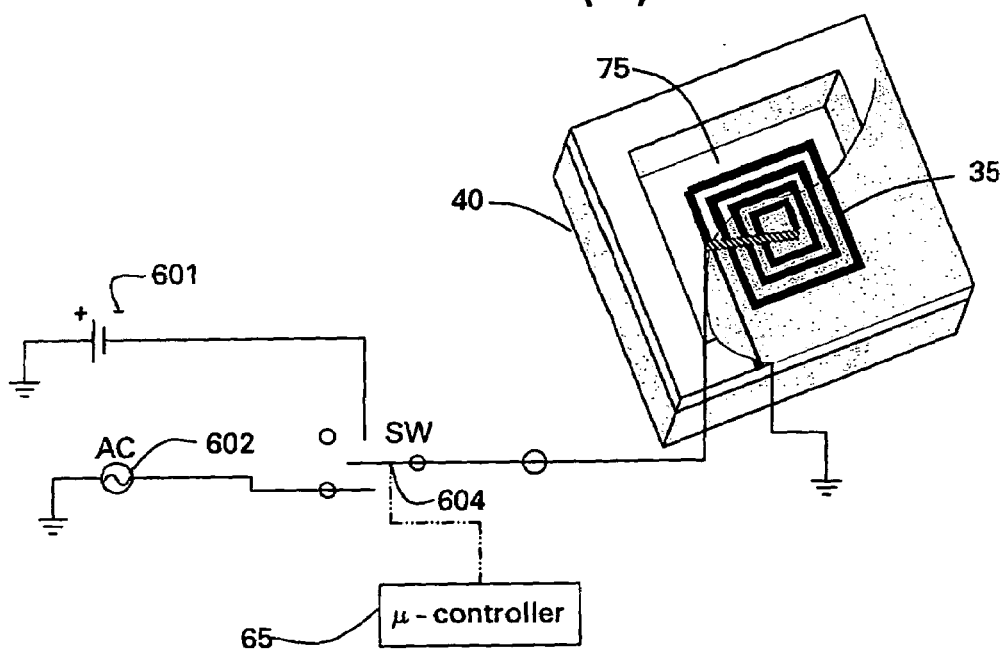

There is shown in FIGS. 3(a)-(c) an exemplary implementation of the MEMS current sensor hereof. As shown, a deflectable membrane 46 is supported over the cavity 115 by structural supports 40. Located on top of and supported by the deflectable membrane 46 in the cavity region of the illustrated MEMS structure is a conductor configured as a coil 35. At a base (i.e., floor) of the cavity region, there is a metal conductive bottom electrode.

A number of exemplary excitation sources 60 are shown in FIG. 3(c) for the MEMS current sensor. For example, a battery 601 and an A-C excitation source 602 are depicted. The depicted micro-controller 65 may be used to control the application of the excitation source from the battery 601 and/or the AC source 602 to the MEMS-based magnetic field sensing component 25, as discussed in regards to FIG. 1. Thus, depending on, for example, the application or context in which the current is being measured and/or the implementation of the magnetic field shaping component 5 and the magneto-MEMS component 30, the excitation source 60 can be a DC voltage, an AC voltage, or other excitation quanta. Any one or more of the excitation sources 60 may be used in accordance with the MEMS current sensor 100. The excitation source may be, for example, a current source, a voltage source, a resonance generator, or a grounding reference point.

In one aspect, the switch (SW) 604 of FIG. 3 is connected to ground, and the coil 35 effectively forms a loop. The thus formed loop may be coupled to a current carrying first conductor, where the current in the first conductor is the current being sensed by the MEMS current sensor 100. The current in the first conductor (i.e., being sensed) produces a magnetic field in the coil 35 loop; however, there is no voltage produced in the coil 35 so long as the magnetic flux is not changing. The magnetic field may be changed (i.e., varied) by, for example, moving the coil 35 into and out of the magnetic field of the first conductor to obtain a time varying magnetic flux. The magnetic field also may be changed by controlling the switching of a reference signal by the micro-controller 65. The mutual inductance between the two loops, established by virtue of the loop coupled to the varying magnetic field, may be used derive the current in the first current carrying conductor from the voltage produced as a result of the mutual inductance between the two conductor loops.

In another aspect, when the magneto-MEMS component 30 is in the vicinity of a current carrying conductor and a current is flowing in the coil 35, the magnetic field generated by the first conductor will exert a force (e.g., Lorentz force) on the magnetic-to-mechanical converter 35, the coil conductor located atop the membrane. The detected magnetic force exerts a force on the coil 35 that can move the coil 35. Hence, a magnetic-to-mechanical conversion of the detected magnetic field occurs. As shown in FIG. 3(b), the membrane 46 may be deflected downward into a cavity formed by the membrane 46, the support structure 40, and the top and bottom electrodes. The top and bottom electrodes act as the mechanical sense component 45 by sensing the mechanical indication of the magnetic field generated by the current being sensed. The top and bottom electrodes operate as, for example, a capacitor. Due to the variance in the distance between the top (coil) and the bottom electrode, the magnitude and direction of the current being sensed may be determined.

The mechanical sense component 45 may be, for example, a capacitor, a piezoresistor, or an optical sensor. Based on a mechanical change, the capacitor, piezoresistor, and optical sensor can be used to detect and provide an indication of a mechanical change. Placing a stress on the piezoresistor will change the resistance thereof. Changing the energy exposure of the optical sensor will change a state of the optical sensor, thereby allowing the optical sensor to signal a mechanical change.

A transducer may be used to implement the mechanical sense component 45 to provide an indicator of a detectable measurand (e.g., change in distance between top and bottom electrodes) induced by the magnetic-to-mechanical converter 35 (e.g., the deflectable membrane). The transducer may be used to convert a mechanical measurand (e.g., a displacement, a vibration, a stress, a strain, a torsional stress, a moment, a deflection, a rotation, an elongation, a compression, etc.) into another form or type of signal (e.g., electrical—a current or voltage, a pressure, or an optical signal, etc.), that is more readily or conveniently used for further processing and/or output purposes.

Figure 4A:
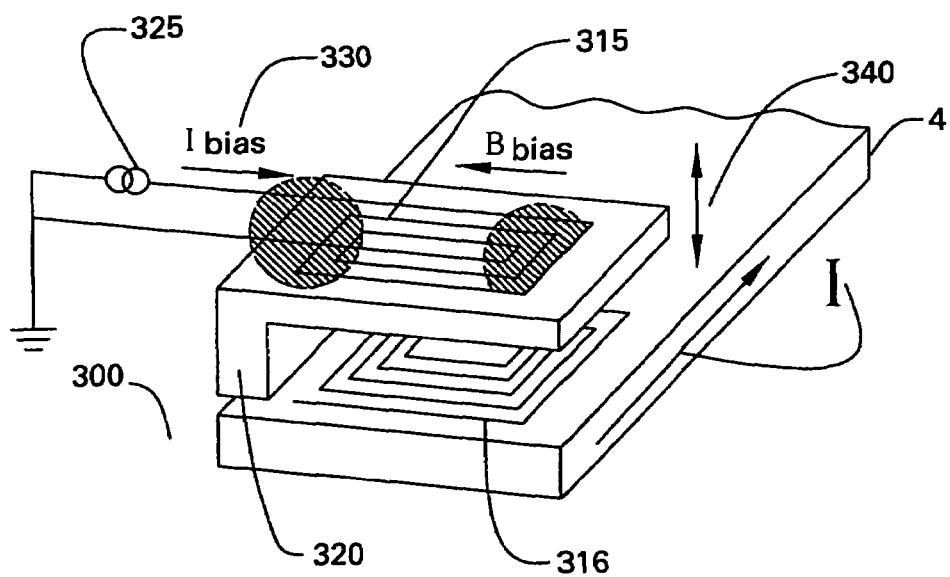

As illustrated in FIGS. 4(a) and 4(b), an exemplary MEMS device 300 is placed in the vicinity of a first conductor 4, in the magnetic field generated by a current I flowing therein. The MEMS device 300 is illustrative, and not limiting, of the types of MEMS devices applicable with the disclosure herein. That is, the particular MEMS device 300 shown in FIGS. 4(a) and 4(b) is but one example of the many possible MEMS devices suitable for use in the MEMS based current sensor of the present disclosure.

The MEMS device 300 includes a second conductor 315. In one embodiment, the second conductor 315 is a coil, similar to the magnetic-to-mechanical converter 35 (FIG. 1) disposed on top of a micro-mechanical structure 320. The micro-mechanical structure 320 is, in the illustrated example, a cantilever having a free end and a supported end.

The coil 315 is connected to an excitation source 325, for example, a current source. The excitation source 325 is preferably controllable by a compensator having a controller (not shown). The controller preferably, at least, controls the application and/or selection of excitation source(s) 325. The controller may be, for example, a switch, an analog processor, a digital signal processor, a digital computing device or an analog-computing device. In the present example, the controller controls at least an on, off, and a value of a bias current 330 supplied to the coil 315.

A reference component may be included for enhancing a function of the MEMS current sensor. For example, a switch may be included for activating, processing, and controlling logic functions associated with the MEMS current sensor. Other functions, such as, balancing and exciting the MEMS current sensor can be provided by a compensator.

The coil 315, based on its configuration, bias current 330, and being disposed in the magnetic field generated by the current I, acts to shape the magnetic field generated by the current I. In particular, the magnetic field generated by the current I is acted upon and influenced by the bias current 330 supplied to the coil 315. The Lorentz force, due to the interaction of magnetic fields generated by the current I in the first conductor 4 and the bias current 330 in the coil 315, causes a mechanical action in the MEMS device 300.

Depending on its polarity, the Lorentz force acts to deflect the cantilever 320 at the free end and supported end thereof in a direction indicated by an arrow 340. Since the cantilever 320 is supported at one end, the free end is free to move up or down in response to the Lorentz force acting thereon. The support for the cantilever 320 is located to counteract (i.e., nullify) any deflecting forces acting on the supported end of the cantilever 320. The induced Lorentz force acts along the short ends of the coil 315 (i.e., the ends nearer the free and supported ends of the cantilever 320) based on the geometric configuration of the coil 315 and the bias current. The supported end of the cantilever 320 has a mechanical sense component (not shown) located thereon for sensing the mechanical movement of the cantilever 320. In the example shown, for example, a piezoresistor may be connected to the cantilever 320 to sense the movement thereof that, in turn, imparts a stress on the piezoresistor. The stress on the piezoresistor affects the resistance value of the piezoresistor. The changing resistance of the piezoresistor can be used by the output component 70 to convert from a mechanical to an electrical change, and thus determine the value of the current being sensed.

The amplitude and direction of the deflection (mechanical action) experienced by the cantilever 320 is proportional to the current I and its polarity. Therefore, the current I flowing in the first current conductor 4 can be sensed. In another embodiment, a third current carrying conductor 316 (FIG. 4(b)) is used to obtain a force balance, active sensing, zero balance sensing, and an equilibrium condition.

As disclosed herein, the need to physically contact a first current carrying conductor 4 to sense the current I is obviated. It is also noted that due to the small dimensions of micromachined MEMS device 300, the MEMS-based current sensor 100 is itself a dimensionally small device. Accordingly, the change in the magnetic field being sensed by the MEMS-based current sensor 100 at various points on the sensor is very small. The MEMS-based current sensor 100 is therefore accurate since there is no need to compensate for variances across the measuring sensor itself.

In another aspect, due to batch manufacturing techniques of micro-machining and the cost efficiencies therein, the MEMS-based current sensor 100 in accordance with the disclosure herein can be manufactured in large batches using micro-machining processes, such as, for example, photo lithography and etching. The manufacture of 10 or 1000 current sensors can be realized for a small increase in cost. Also, more than one MEMS device may be manufactured per MEMS-based sensor 100. As noted above, the MEMS device of FIG. 3 is but one example of the current sensors in accordance with the present disclosure. Other embodiments of the MEMS-based current sensor 100 may include multiple MEMS devices in the current sensor for the purpose of, for example, magnetic field shaping, magnetic field sensing, current value indicating, and other purposes. In regard to micro-machining techniques, more than one (i.e., multiple) MEMS device can be included in one MEMS-based sensor 100, thus providing a robust packaging since the multiple MEMS devices may be provided on a common substrate die and packaged therewith. The need for an external interface(s) between the multiple MEMS devices is avoided.

Due at least in part to the use of MEMS technology, the magnetic forces required to operate the MEMS devices are relatively small. The current sensor hereof thus tends to generate relatively little heat. This is advantageous in that there is little heat generated by the current sensors herein that may introduce an error in the sensing of the current I.

In one aspect, the bias current 330 can be switched on and off under the control of a user. The bias current 330 may be considered a reference current since its value is known and controllable. As a current having a known value, the bias current 330 (i.e., the reference current) can be used to compensate for the effects of temperature, aging of the sensor, environmental factors, self-inductance errors, etc. This can be accomplished by monitoring the state of deflection of the cantilever 320 with the bias current 315 on and the bias current 330 off. The deflection value obtained when the bias current 330 is off can be compared to the deflection value when the bias current 330 is turned on, for example, by obtaining a ratio of the deflection values of the bias current 330 in order to compensate for any cantilever deflecting effects when the bias current 330 is off. Thus, the MEMS based current sensor 100 can be auto-compensating to account for environmental, temperature, and other effects.

It is noted that the auto-compensating aspects and the mechanical actuated current sensing discussed herein are not limited to the particular current sensor of FIG. 4. For example, with reference to FIG. 3, there is shown the MEMS device compatible with the MEMS-based current sensor 100. The MEMS device has a deflectable membrane 46 that can be used to detect and indicate the value (e.g., amplitude and polarity) of the unknown current being measured. The membrane 46 is suspended over a cavity that exposes the membrane and the coil being supplied by a controllable current source to the magnetic field of the conductor having the current being sensed flowing therethrough. The current carrying conductor or coil coupled, for example capacitively, to the current being measured is disposed on the membrane.

While the MEMS devices of FIGS. 3 and 4 are not the same, the controllable bias current and micro-mechanical aspects of the MEMS device of FIG. 3 allow it to be auto-compensating. This aspect is not to be limited to the exemplary MEMS devices discussed in detail herein. The MEMS-based devices discussed herein may be manufactured using any number of known micro-machining techniques.

Various actuating MEMS devices and configurations thereof may be used in the MEMS-based current sensor 100 without departing from the scope and spirit of the present disclosure.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A micro-electromechanical system (MEMS) current sensor, comprising:
   a first conductor for measuring a current;
   a first coil for receiving a first predetermined bias current coupled to said current;
   a second coil for receiving a second predetermined bias current coupled to said current; and
   a MEMS-based magnetic field sensing component having a magneto-MEMS component for sensing a shaped magnetic field and, in response thereto, providing an indication of said current in said first conductor.

2. The MEMS current sensor of claim 1, wherein said MEMS-based magnetic field sensing component comprises at least one of a compensator for enhancing a function of said MEMS-based magnetic field sensing component, and an output component.

3. The MEMS current sensor of claim 1, wherein said magnetic field shaping component comprises at least one of a current-to-magnetic field converter and a magnetic field-to-magnetic flux converter.

4. The MEMS current sensor of claim 1, wherein said magneto-MEMS component comprises a magnetic-to-mechanical converter coupled to a structural component for providing a mechanical indication of said shaped magnetic field.

5. The MEMS current sensor of claim 4, wherein said MEMS-based magnetic field sensing component further comprises a reference component coupled to said structural component for providing a reference indicator for said mechanical indication.

6. The MEMS current sensor of claim 5, wherein said reference component comprises a current carrying conductor, electrical conductive coil, a magneto-restrictive element, and an element generating a Lorentz Force.

* * * * *